(12) United States Patent
Singer et al.

(10) Patent No.: US 7,400,699 B2
(45) Date of Patent: Jul. 15, 2008

(54) ILLUMINATION SYSTEM WITH RASTER ELEMENTS OF DIFFERENT SIZES

(75) Inventors: Wolfgang Singer, Aalen (DE); Wilhelm Ulrich, Aalen (DE); Martin Antoni, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 117 days.

(21) Appl. No.: 10/040,717

(22) Filed: Jan. 7, 2002

(65) Prior Publication Data

US 2002/0131181 A1 Sep. 19, 2002

(30) Foreign Application Priority Data

Jan. 8, 2001 (DE) ................................ 101 00 265

(51) Int. Cl.
*G21K 5/04* (2006.01)
*G21K 1/06* (2006.01)
*G03B 27/42* (2006.01)
*G03B 27/72* (2006.01)
*G02B 27/10* (2006.01)

(52) U.S. Cl. ............................. 378/34; 378/84; 378/85; 250/492.2; 355/53; 355/67; 355/70; 355/71; 359/621; 359/622; 359/627

(58) Field of Classification Search ................... 378/34, 378/84, 85, 147, 149; 359/621, 622, 623, 359/624, 627; 355/53, 67, 70, 71; 250/492.2, 250/504 R See application file for complete search history.

(56) References Cited

U.S. PATENT DOCUMENTS

| | | | | |
|---|---|---|---|---|
| 4,682,885 A | * | 7/1987 | Torigoe | 355/67 |
| 5,098,184 A | | 3/1992 | Van den Brandt et al. | 353/102 |
| 5,251,067 A | * | 10/1993 | Kamon | 359/628 |
| 5,315,629 A | * | 5/1994 | Jewell et al. | 378/34 |
| 5,339,346 A | * | 8/1994 | White | 378/34 |
| 5,361,292 A | * | 11/1994 | Sweatt | 378/34 |
| 5,439,781 A | * | 8/1995 | MacDowell et al. | 430/311 |
| 5,512,759 A | * | 4/1996 | Sweatt | 250/492.1 |
| 5,581,605 A | * | 12/1996 | Murakami et al. | 378/84 |
| 5,594,526 A | * | 1/1997 | Mori et al. | 355/67 |

(Continued)

FOREIGN PATENT DOCUMENTS

DE 19903807 A1 11/1999

(Continued)

OTHER PUBLICATIONS

Eugene Hecht and Alfred Zajac. Optics (Reading, MA: Addison-Wesley, 1979), p. 144-145.*

(Continued)

*Primary Examiner*—Allen C. Ho
(74) *Attorney, Agent, or Firm*—Ohlandt, Greeley, Ruggiero & Perle L.L.P.

(57) ABSTRACT

There is provided an illumination system for lithography with wavelengths of $\leq 193$ mn. The system comprises a first optical element, which is divided into first raster elements and lies in a first plane. The first plane defines an x-direction and a y-direction, the first raster elements each have an x-direction and a y-direction with an aspect ratio, and at least two of the first raster elements have aspect ratios of different magnitude.

18 Claims, 5 Drawing Sheets

U.S. PATENT DOCUMENTS

| | | | |
|---|---|---|---|
| 5,636,003 A | 6/1997 | Tanitsu et al. | 355/67 |
| 5,662,401 A * | 9/1997 | Shimizu et al. | 353/38 |
| 5,669,708 A * | 9/1997 | Mashima et al. | 362/341 |
| 5,677,939 A * | 10/1997 | Oshino | 378/34 |
| 5,719,709 A | 2/1998 | Kodaka | 359/694 |
| 5,737,137 A * | 4/1998 | Cohen et al. | 359/859 |
| 5,754,278 A * | 5/1998 | Kurtz | 355/67 |
| 5,805,365 A * | 9/1998 | Sweatt | 359/858 |
| 5,896,438 A * | 4/1999 | Miyake et al. | 378/34 |
| 5,912,725 A * | 6/1999 | Tanitsu | 355/53 |
| 5,963,305 A * | 10/1999 | Mizouchi | 355/67 |
| 6,002,467 A | 12/1999 | Nishi et al. | 355/61 |
| 6,057,899 A * | 5/2000 | Tanaka et al. | 349/95 |
| 6,181,482 B1 * | 1/2001 | Grafton | 359/670 |
| 6,195,201 B1 * | 2/2001 | Koch et al. | 359/366 |
| 6,198,793 B1 * | 3/2001 | Schultz et al. | 378/34 |
| 6,219,111 B1 * | 4/2001 | Fukuda et al. | 349/5 |
| 6,260,972 B1 * | 7/2001 | Robinson et al. | 353/38 |
| 6,337,759 B1 * | 1/2002 | Yamamoto | 359/267 |
| 6,400,794 B1 * | 6/2002 | Schultz et al. | 378/34 |
| 6,402,325 B1 * | 6/2002 | Yamamoto | 353/94 |
| 6,438,199 B1 * | 8/2002 | Schultz et al. | 378/34 |
| 6,504,896 B2 * | 1/2003 | Miyake et al. | 378/34 |
| 6,507,440 B1 * | 1/2003 | Schultz | 359/626 |
| 6,594,334 B1 * | 7/2003 | Ota | 378/34 |
| 6,637,892 B1 * | 10/2003 | Okuyama et al. | 353/38 |
| 6,704,095 B2 * | 3/2004 | Schultz | 355/67 |
| 6,741,394 B1 * | 5/2004 | Tanitsu et al. | 359/619 |
| 6,833,904 B1 * | 12/2004 | Komatsuda | 355/67 |

FOREIGN PATENT DOCUMENTS

| | | |
|---|---|---|
| WO | WO9949505 | 9/1999 |

OTHER PUBLICATIONS

European Search Report dated Feb. 16, 2006 in connection with corresponding European Patent Application No. 01127095.6-2222.

* cited by examiner

ILLUMINATION SYSTEM WITH RASTER ELEMENTS OF DIFFERENT SIZES

CROSS REFERENCE TO RELATED APPLICATIONS

The present application is claiming priority of German Patent Application Serial No. 101 00 265.3, which was filed on Jan. 8, 2001.

BACKGROUND OF THE INVENTION

1. Field of the Invention

The present invention concerns an illumination system, particularly one that is used for lithography, for example, VUV and EUV-lithography with wavelengths of less than or equal to 193 nm, which illuminates a field, wherein the illumination system comprises at least one light source as well as optical elements, which are divided into raster elements.

2. Description of the Prior Art

In order to be able to even further reduce the structural widths for electronic components, particularly in the submicron range, it is necessary to reduce the wavelength of the light utilized for microlithography.

For example, lithography with soft x-rays is conceivable at wavelengths of smaller than 193 mn. A double-facetted illumination system for such wavelengths has become known, for example, from DE 199 03 807. The disclosure content of DE 199 03 807 is incorporated herein by reference.

In the case of the illumination system known from DE 199 03 807, first raster elements, which are also denoted field raster elements, are illuminated via collecting optics. When arranged in reflection, illumination is produced at a specific angle of incidence. Therefore, the illuminated field on the field raster elements is preferably elliptical. The field raster elements are configured rectangularly, however, corresponding to the desired field in the object plane, which coincides with the reticle plane.

Each field raster element is imaged in a field in an object plane, in which the reticle is positioned. Since each field raster element contributes to the uniformity of the illuminated field, field raster elements that are only partially illuminated adversely affect the uniformity in the object plane. Thus, only completely illuminated field raster elements should be used.

In systems, such as are known from DE 199 03 807, the first raster elements or facets have a typical aspect ratio of approximately 1:16. In such systems, field raster elements cover only about 80% of the area illuminated by the light source, i.e. approximately 20% of the power is lost. Since the number of field raster elements is limited by the optical elements arranged in the light path from the light source to the reticle plane behind the optical element with first raster elements and for reasons of geometry and capability of construction, a better efficiency for an illumination system as is known from DE 199 03 807 cannot be achieved simply by increasing the number of field raster elements.

SUMMARY OF THE INVENTION

An object of the invention is thus to provide a imaging system that overcomes the disadvantages of the prior art, and particularly has a high utilization of the irradiated light power.

The object is solved according to the present invention by an illumination system, particularly for lithography with wavelengths of $\leq 193$ nm, comprising a first optical element, which is divided into first raster elements and lies in a first plane, whereby the plane defines an x-direction and a y-direction, whereby the images of the first raster elements superimpose in an object plane of the illumination system and the first raster elements each have an x-direction and a y-direction with an aspect ratio, characterized in that at least two raster elements each have an aspect ratio of different magnitudes.

According to the invention, in order to minimize the light losses, the first raster elements, which are also denoted field raster elements, have different shapes. For example, they can be of different sizes or the aspect ratio of the individual field raster elements may vary over the field raster element mirror, so that a better covering of the illuminated area in the plane where the field raster elements are situated by the plurality of field raster elements and thus a higher efficiency of the illumination system is achieved.

In order to compensate for the different sizes or aspect ratios of the first raster elements or field raster elements, the second raster elements or pupil raster elements are anamorphotic. The anamorphism or astigmatic action of each pupil raster element is adapted for this purpose to the aspect ratio of each field raster element.

The essential characteristic of the invention is thus that pupil raster elements of different anamorphotic effect combined with field raster elements of different aspect ratios lead to a higher energy utilization of the light source by the illumination system. This is achieved in that the second raster elements have different anamorphotic effects, so that the aspect ratio of the images of the first raster elements in the object plane of the illumination system, in which, for example, a reticle is positioned, essentially corresponds to the field aspect ratio, independently of the aspect ratio of the first raster elements. The field raster elements may have, but need not have, an anamorphotic effect.

An anamorphotic effect can be realized in the simplest case by a toric surface shape, i.e., the radii of curvature of a mirror in the x- and y-directions differ at the vertex of the mirror in x- and y-directions, i.e., $R_y$ is not equal to $R_x$.

Other advantageous embodiments of the invention are the subject of the subclaims.

BRIEF DESCRIPTION OF THE DRAWINGS

The invention will be described below, for example, on the basis of the drawings.

Here.

DESCRIPTION OF THE INVENTION

Figure 1:
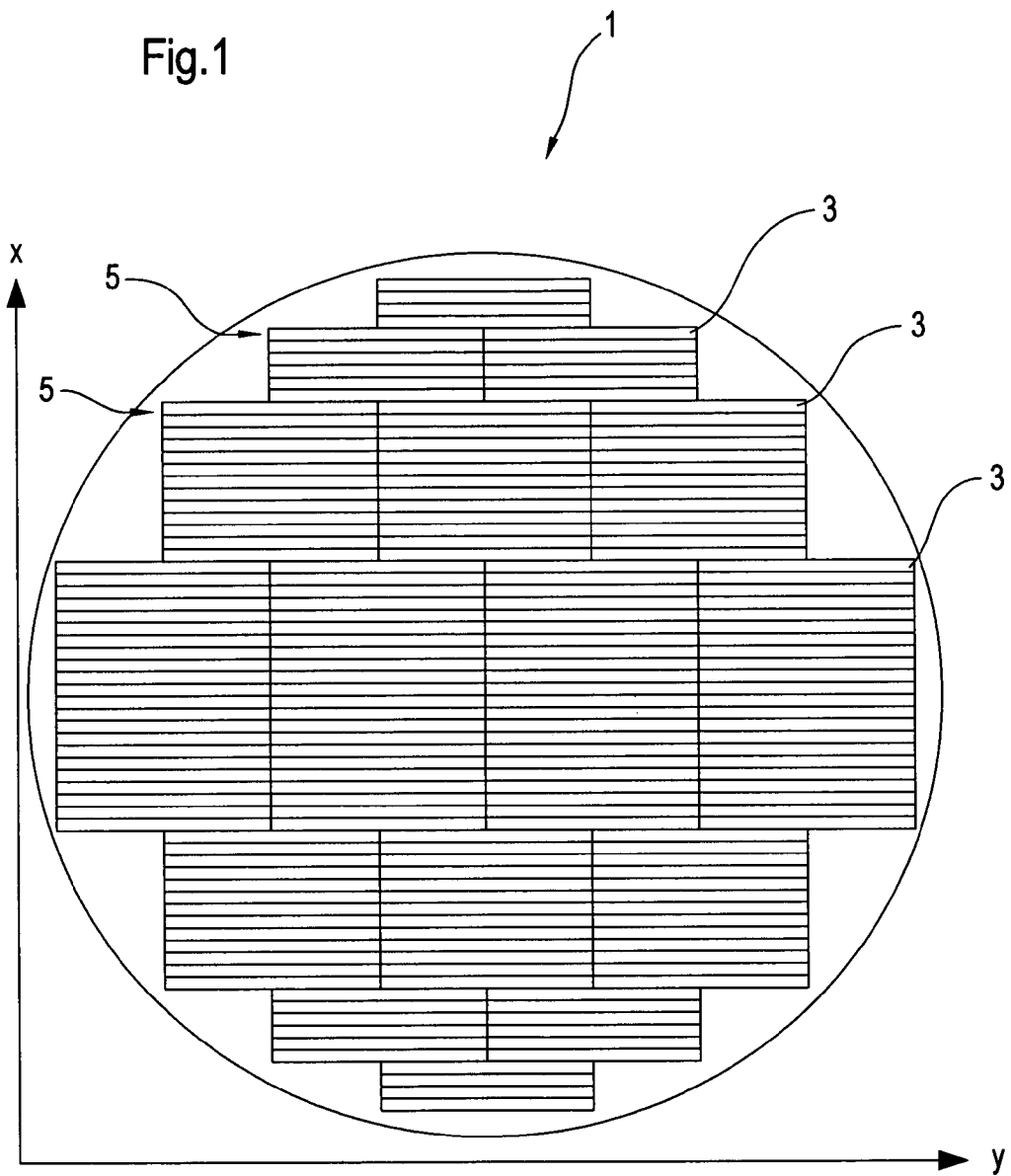
FIG. 1 shows a field raster element plate with many identical field raster elements, which are either isotropic or anamorphotic.

FIG. 1 shows a conventional configuration of a field raster element plate 1 with field raster elements 3 of identical size, as have been made known from DE 199 03 807.

The field raster elements 3 have a typical aspect ratio of approximately 1:16. Approximately 200 field raster elements 3 are arranged on a slightly elliptical illuminated surface. Approximately 80% of the illuminated surface is covered by field raster elements, i.e., approximately 20% of the power is lost.

Figure 2:
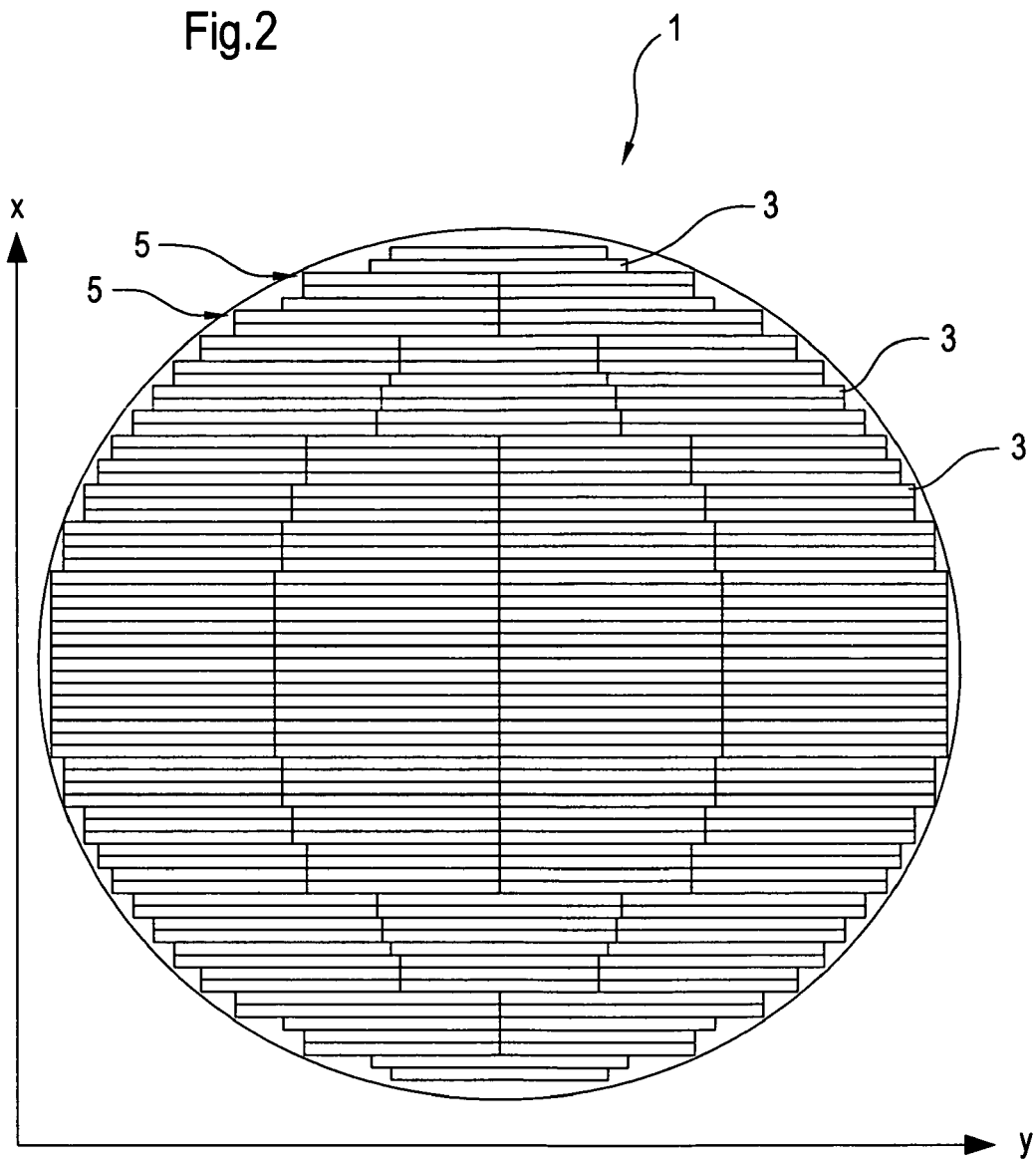
FIG. 2 shows the configuration of a field raster element plate according to the invention with field raster elements with different aspect ratios. For better arrangement, all the field raster elements of one row are each of the same height; only the width is changed.

In order to minimize this loss, according to the invention, the field raster elements, as shown in FIG. 2, have different shapes. In this way, field raster elements 3 can be configured of different dimensions, and also the aspect ratio of the individual field raster elements 3 over a plate or mirror, i.e., field raster element plate 1, may vary so that a better covering of the illuminated surface by field raster elements and thus a higher efficiency result.

A field raster element plate 1 configured in this way is shown in FIG. 2; for this purpose, field raster elements 3 of the field raster element plate 1 shown in FIG. 1 were reconfigured so that a better covering results. The efficiency can be increased to more than 95%. The number of field raster elements was slightly increased at the same time, which is in fact not necessary, but is helpful. The field raster elements are arranged in rows 5.

For a better arrangement, all field raster elements of a row 5 in the embodiment according to FIG. 2 are of the same height; only the width is varied. The x-direction runs upward to the top, and the y-direction runs to the right.

Figure 3:
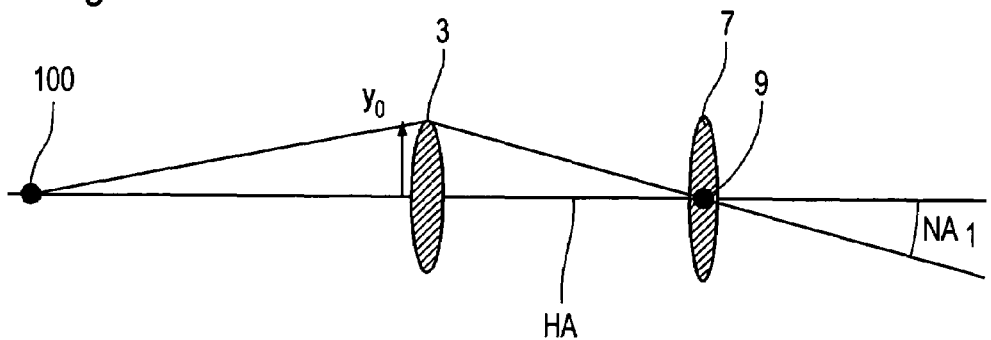
FIG. 3 shows a schematic diagram for the derivation of formulas for isotropic field raster elements and pupil raster elements.

The following derivation based on FIG. 3 gives the different refractive powers by a calculation according to geometric-optical formulas, as a function of the different widths of the field raster elements.

The case of a light channel between a field raster element 3 and a pupil raster element 7 will be considered first, wherein the field raster element 3 is isotropic, as is also pupil raster element 7. For this case of an isotropic field raster element 3 and exact Köhler illumination, the size of field raster element 3 with aperture $NA_1$ behind pupil raster element 7, respectively, for the double-facetted system is coupled via:

$$NA_1 = \frac{y_0}{Z} \quad (1)$$

wherein
$y_0$: height of the field raster element (half the diameter in the y-direction)
Z: distance between field raster element and pupil raster element Further, a light-source image 9, which field raster element 3 produces, lies in plane of the pupil raster element 7, i.e., the point of intersection of the aperture beam and the optical axis HA lies in the plane of pupil raster element 7. For the refractive power of the field raster element in this case, it follows that $$\frac{1}{f_y^{fw}} = \frac{1}{Z} + \frac{1}{D} \quad (2)$$

wherein
D: distance between light source and field raster elements
$f_y^{fw}$: focal distance of the field raster elements in the y-direction.

If one assumes values that are typical for an EUV illumination system:
D=1200 mm for the distance D between the light source and the field raster elements
Z=900 mm for the distance between the field and the pupil raster elements
β=−3.5:
typical lateral magnification for the pupil raster element
$S_1$=3150 mm:
distance between the vertex of the pupil raster element and the image of the field raster element $S_1$=−Z·β
$2 \times x_0 \times 2y_0$=2.8 mm×46 mm:
size of the field raster element, then the following design values result for isotropic field raster elements or pupil raster elements:
focal distance of the field raster element:
$f^{fw}$=514.286 mm focal distance of the pupil raster element:
$f^{pw}$=700 mm radius of curvature of the field raster element in a reflective design:
$R^{fw}$=−2 $f^{fw}$=−1028.571 mm radius of curvature of the pupil raster element in a reflective design:
$R^{pw}$=−1400 mm.

If all field raster elements 3 are made equal in the x-direction, as shown in FIG. 2, and the aspect ratios of field raster elements 3 are changed only by changing the width in y, then Equation (1) can be applied in the x-direction. Then the values of the previous section apply for the x-direction. For the y-direction, it is necessary to change the refractive power of the pupil raster elements.

If the refractive power of pupil raster element 7 is changed, then the magnification is also changed. Therefore, the distance between the vertex of the pupil raster elements and the image of the field raster elements $S_1$ is also changed to $S'_1$, while the distance between field raster elements and pupil raster elements on the object side remains the same: $S_0$=−Z.

Figure 4:
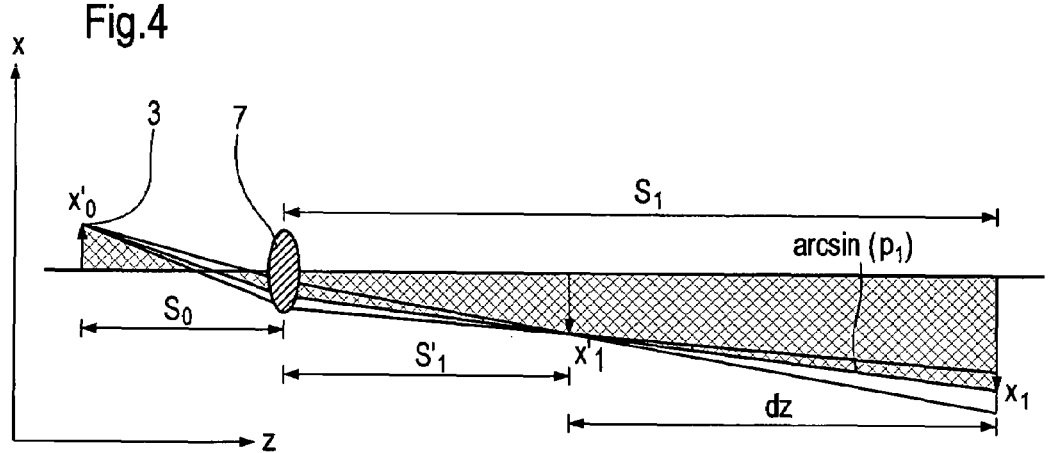
FIG. 4 shows a schematic diagram for the derivation of the linear magnification for anamorphotic pupil raster elements, whereby the field raster elements are configured as field raster elements with large convergence.

The image plane with distance $S_1$ to the pupil raster elements is imaged by the imaging optics of the illumination system in the object plane to be illuminated. If the image of a field raster element is formed in another plane than the image plane with distance $S_1$ to the vertex of the pupil raster elements, the image in the object plane that is to be illuminated, which coincides with the reticle plane, is blurred. This must be taken into account in the design of the pupil raster element with a specific lateral magnification, in order to prevent unnecessary large light losses. As shown in FIG. 4, the surface to be illuminated in the plane with distance $S_1$ conjugated to the object plane is thus broadened by $$\Delta y' = (S_1 - S'_1) \cdot \tan(\arcsin(p_1)) = dz \cdot \tan(\arcsin(p_1))$$
$$\approx dz \cdot p_1 \quad (3)$$

wherein
Δy': half broadening of the length to be illuminated in the plane with distance $S_1$
dz=$S_1$−$S'_1$: distance between the image planes
$p_1$: optical direction cosine of the maximum aperture beam for the imaging beam path with a point-like light source.
In addition, the illumination is broadened in case of a source with a finite size by the aperture of the secondary light source in the object plane. Usually, this aperture and the additional broadening that it produces, however, are negligibly small. This small amount of broadening by the finite source size will be disregarded in the following derivation.

$$\beta y_0 \approx \beta' y'_0 + dz' p_1 \quad (4)$$

β: lateral magnification of the imaging by the conventional pupil raster element with normal field raster element
β': lateral magnification of the anamorphotic pupil raster element in the y-direction
$y_0$: field raster element height for the conventional design
$y_0'$: field raster element height for the design with modified aspect ratio
dz': longitudinal image misalignment in the image plane behind the pupil raster element
$p_1$: optical direction cosine in the image space of the pupil raster element (y-component); corresponds to the aperture behind the raster element condenser.

If the well-known imaging equation of the first order is inserted for $p_1$:

$$p_1 = \frac{1}{f_y} y'_0 + \frac{1}{\beta'} p'_0 \quad (5)$$

wherein
$p'_0$: optical direction cosine in the object space of the pupil raster element (y-component)
$f_y$: focal distance of the pupil raster element in the y-direction, then after converting and inserting the distances $S_1$, $S_1$, $S_0$ with $\beta'=S'_1/S_0$, $\beta=S_1/S_0$ and $dz=S_1-S'_1$:

$$S'_1 = \frac{S_1 S_0 (y'_0 - S_0 p'_0)}{S_0 (y'_0 - S_0 p'_0) + S_1 (y'_0 - y_0)} \quad (6)$$

$p'_0$ must now still be selected, i.e., the collecting or convergent power of field raster elements 3 must be determined.

For this purpose, one uses generalized Equations (1) and (2) and obtains from $$p_0 = y'_0 \left( \frac{1}{f_y^{fw}} - \frac{1}{D} \right) \quad (7)$$

wherein
$y'_0$: height of the field raster elements with modified field aspect ratio
$f_y^{fw}$: focal distance of the field raster elements in the y-direction
D: distance between light source and field raster elements.

If the following parameters are selected, which are taken from the typical design example above, wherein the following is also valid:
$y_0=23$ mm:

half the diameter of the "normal" non-anamorphotic field raster elements in the y-direction,
M=10 mm:

diameter of the pupil raster elements, and if one also selects as the raster element size for the field raster elements with modified aspect ratio:

$y_0'=26$ mm:

half the diameter of the field raster elements with modified aspect ratio in the y-direction, then one has three possibilities in principle for realization. Only the focal distances are indicated each time; the corresponding radii of curvature $R_x$ and $R_y$ in the x-direction and y-direction of the anamorphotic mirror are each indicated by $-2f_x$ or $-2f_y$.

In a first embodiment according to FIG. 4, field raster elements 3 with larger convergence are utilized. Thus the beam bundle behind field raster element 3 is not vignetted by pupil raster element 7 of finite extent, so that the following must apply $$p'_0 > \frac{|y'_0| + \frac{M}{2}}{S_0} \quad (8)$$

here $p'_0 > -0.034$. With $p'_0=-0.033$, the following values are obtained from Equation (6) and Equation (7) for the focal distances:

Focal distance in the y-direction of the field raster element with height of 26 mm:
$f_y^{fw}=475.61$ mm
Focal distance in the y-direction of the assigned pupil raster element:
$f_y=429.28$ mm
Focal distance in the x-direction of the field raster element with height of 1.4 mm:
$f_x^{fw}=514.286$ mm
Focal distance in the x-direction of the assigned pupil raster element:
$f_x^{pw}=700$ mm.

Figure 5:
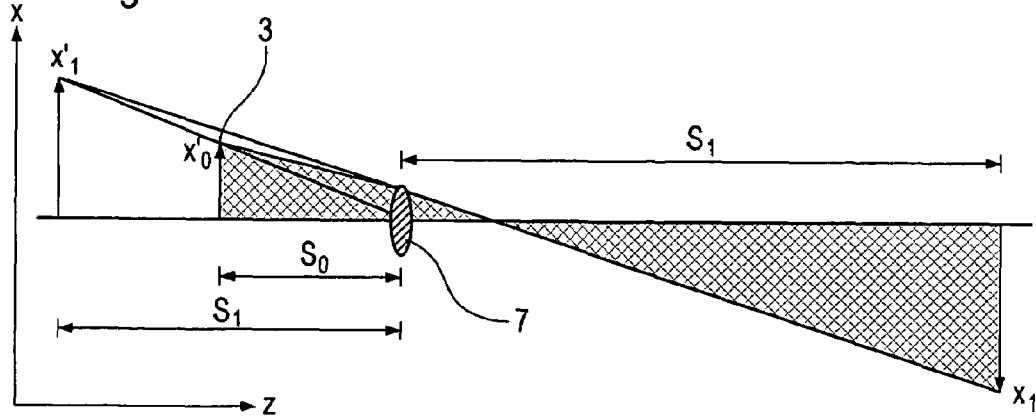
FIG. 5 shows a schematic diagram for the derivation of the linear magnification for anamorphotic pupil raster elements, whereby the field raster elements are configured as field raster elements with weak convergence.

In a second form of embodiment according to FIG. 5, weak convergent field raster elements are used.

Thus the beam bundle behind field raster element 3 is not vignetted by pupil raster element 7 of finite extent, so that the following must now be applied:

$$p'_0 < \frac{|y'_0| - \frac{M}{2}}{S_0} \quad (9)$$

here $p'_0 < -0.0233$. With $p'_0=-0.024$, the following values for the focal distances are obtained from Equation (6) and Equation (7):

Focal distance in the y-direction of the field raster elements with height of 26 mm:
$f_y^{fw}=569.34$ mm.
Focal distance in the y-direction of the assigned pupil raster elements:
$f_y=1490.32$ mm.
Focal distance in the x-direction of the field raster elements with height of 1.4 mm:
$f_x^{fw}=514.286$ mm.
Focal distance in the x-direction of the assigned pupil raster elements:
$f_x^{pw}=700$ mm.

For manufacturing reasons, it is preferred to curve the field facets 3 isotropic, i.e., spheric, and to have only pupil raster elements 7 with an anamorphotic effect, in order to compensate for the different aspect ratios of the field raster elements.

Field raster elements 3 with different aspect ratios may be designed, for example as follows:

Focal distance of the field raster element with dimensions of 2.8 mm×46 mm:

$f_x^{fw} = f_y^{fw} = 475.61$ mm.

Focal distance in the y-direction of the assigned pupil raster element:

$f_y = 429.28$ mm

Focal distance in the x-direction of the assigned pupil raster element:

$f_x^{pw} = 700$ mm.

For another field raster element with a height $y_0'' = 20$ mm, which is thus narrower and has a smaller aspect ratio, for example, the following results:

Focal distance of the field raster element with dimensions of 2.8 mm×40 mm:

$f_x^{fw} = f_y^{fw} = 402.68$ mm.

Focal distance in the y-direction of the assigned pupil raster element:

$f_y = 921.72$ mm.

Focal distance in the x-direction of the assigned pupil honeycomb:

$f_x^{pw} = 700$ mm.

And, of course, for the original field raster element with the height of 23 mm:

Focal distance of the field raster element:

$f^{fw} = 514.286$ mm.

Focal distance of the pupil raster element:

$f^{pw} = 700$ mm.

Figure 6:
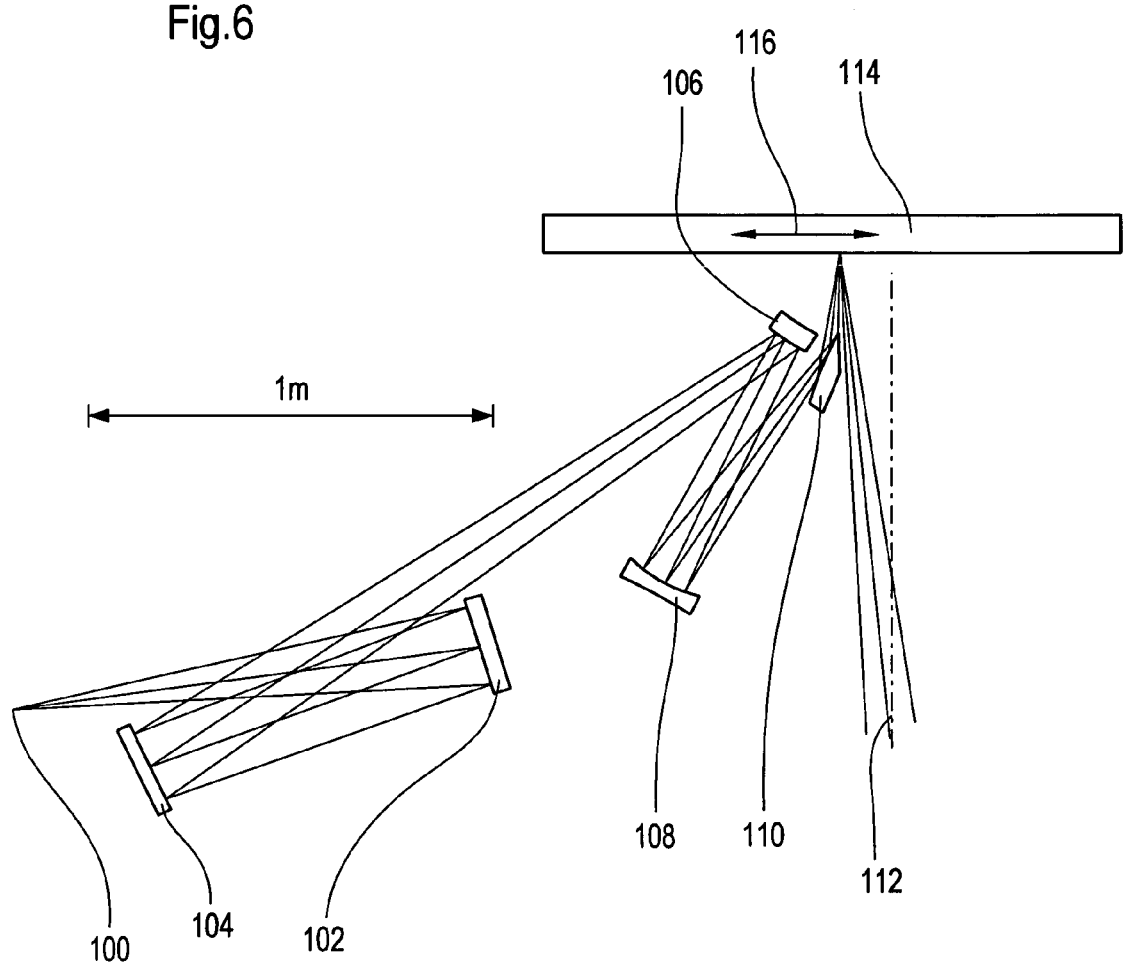
FIG. 6 shows a schematic diagram of an illumination system.

A schematic diagram of an illumination system, in which the invention can be used, is shown in FIG. 6. The illumination system comprises a light source or an intermediate image of a light source 100. The light emitted from the light source or the intermediate image of light source 100, of which only three representative rays are depicted, strikes a first optical element 102 with a plurality of first raster elements, so-called field raster elements. Optical element 102 is thus also denoted a field raster element plate or mirror. The dimensions of the field raster elements on the field raster element plate are selected according to the invention such that a high covering of the area illuminated by the light source results and only a small amount of power from the light source is lost. The second raster elements, the so-called pupil raster element of a second optical element 104, have an anamorphotic effect, which compensates for the different sizes of the field raster elements. The optical elements 106, 108 and 110 arranged in the light path from the light source to a reticle plane after the second optical element 104 essentially serve for the purpose of forming a field in the reticle plane 114. The reticle in the reticle plane is a reflection mask. The reticle can be moved in the depicted direction 116 in the EUV projection system designed as a scanning system.

Exit pupil 112 of the illumination system is illuminated for the most part homogeneously by means of the illumination system shown in FIG. 6. Exit pupil 112 coincides with the entrance pupil of an projection objective. Such a projection objective, for example, with six mirrors, is shown in U.S. patent application Ser. No. 09/503,640, the disclosure of which is incorporated by reference.

Figure 7:
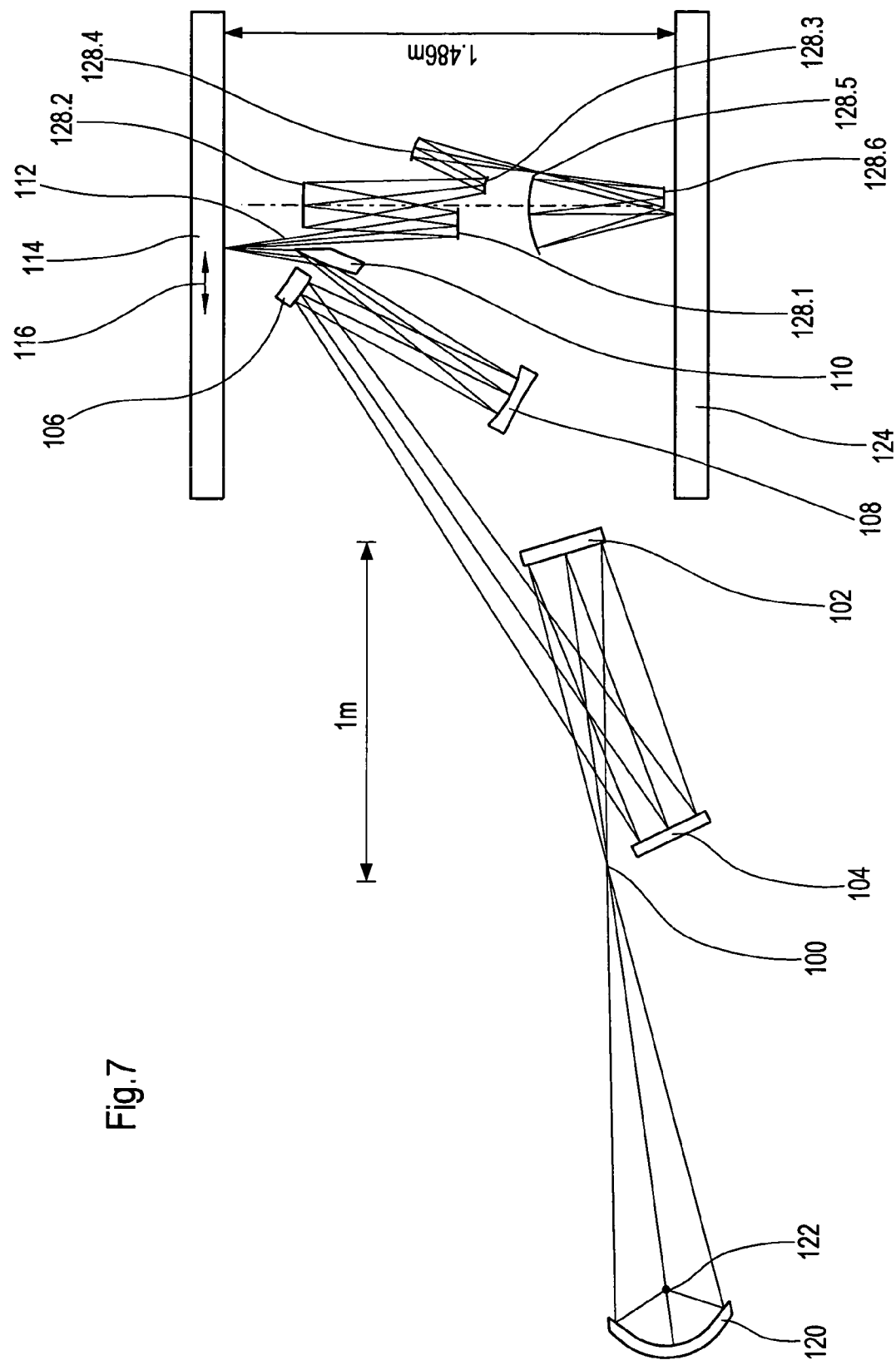
FIG. 7 shows a schematic diagram of a projection exposure system.

The optical part of a projection exposure system beginning at the position of a physical light source 122 up to an object 124 to be exposed is shown in FIG. 7. The same components as in FIG. 6 are given the same reference numbers. The system according to FIG. 7 comprises the physical light source 122, a collector 120, the illumination system from FIG. 6, a projection objective, for example with six mirrors 128.1, 128.2, 128.3, 128.4, 128.5 and 128.6 according to U.S. patent application Ser. No. 09/503,640 as well as object 124 to be exposed.

For the first time an EUV Illumination system, with which the thermal load on the second facetted mirror element can be reduced is provided.

The invention claimed is:

1. An illumination system for lithography with wavelengths of ≦193 nm comprising:
   (a) a first optical element, which is divided into first raster elements and lies in a first plane,
      wherein said first plane defines an x-direction and a y-direction,
      wherein said first raster elements each has an x-dimension and a y-dimension with an aspect ratio, and
      wherein at least two of said first raster elements have aspect ratios of different magnitudes; and
   (b) a second optical element, which is divided into second raster elements, wherein each of said second raster elements is in a light path from a corresponding one of said first raster elements,
   wherein the illumination system defines a field,
   wherein said field is illuminated in an object plane of the illumination system, and
   wherein at least some of said second raster elements have an anamorphotic optical effect, which is selected such that an aspect ratio of images of said first raster elements is substantially the same in said object plane, independent of said aspect ratio of said first raster elements.

2. The illumination system according to claim 1, wherein at least one of said at least two first raster elements with aspect ratios of different magnitude has an anamorphotic optical effect.

3. The illumination system according to claim 2, wherein said first raster elements that have an anamorphotic optical effect are of a shape selected from the group consisting of cylinders and toroids.

4. The illumination system according to claim 1, wherein said at least two first raster elements with aspect ratios of different magnitude have an isotropic optical effect.

5. The illumination system according to claim 4, wherein said first raster elements have an isotropic optical effect.

6. The illumination system according to claim 1, wherein said second raster element that has an anamorphotic optical effect is of a shape selected from the group consisting of cylinders and toroids.

7. The illumination system according to claim 1, further comprising at least one field mirror, wherein said second raster elements and said at least one field mirror image said assigned first raster elements in an object plane of the illumination system.

8. An illumination system for lithography with wavelengths of ≦193 nm comprising:
   a first optical element, which is divided into first raster elements and lies in a first plane; and
   a second optical element, which is divided into second raster elements; and
   an object plane;
   wherein said first raster elements each has an x-dimension and a y-dimension with an aspect ratio,
   wherein at least two of said first raster elements have aspect ratios of different magnitudes,
   wherein said first raster elements are arranged on a support structure in a plurality of rows,
   wherein at least one of said plurality of rows includes at least two of said first raster elements, wherein said illumination system produces a two-dimensional image of said first raster elements in said object plane,
wherein each of said second raster elements is in a light path from a corresponding one of said first raster elements, and
wherein at least one second raster element has an anamorphotic optical effect.

9. The illumination system according to claim 8, further comprising a collector unit, which illuminates said first plane with said first raster elements.

10. The illumination system according to claim 8, further comprising at least one field mirror.

11. The illumination system according to claim 8, wherein said first raster elements are rectangular.

12. The illumination system of claim 8, further comprising:
a source of light,
wherein said first raster elements are arranged on said support structure in an area that is illuminated by said light, and
wherein said first raster elements cover at least 95% of said area.

13. The illumination system according to claim 8, wherein said at least two of said first raster elements having aspect ratios of different magnitudes have x-dimensions that are substantially equal, and y-dimensions that are different.

14. An illumination system for lithography with wavelengths of $\leq 193$ nm comprising:
a first optical element, which is divided into first raster elements and lies in a first plane,
wherein said first raster elements each has an x-dimension and a y-dimension with an aspect ratio,
wherein at least two of said first raster elements have aspect ratios of different magnitude,
wherein said first raster elements are arranged on a support structure in a plurality of rows,
wherein at least one of said plurality of rows includes at least two of said first raster elements,
wherein the illumination system defines a field to be illuminated in an object plane of the illumination system,
wherein said field represents a segment of a ring field,
wherein said first raster elements are mirrors, and
wherein said illumination system produces a two-dimensional image of said first raster elements in said object plane.

15. A projection exposure system for microlithography, comprising:
(a) an illumination system for lithography with wavelengths of $\leq 193$ nm having:
a first optical element, which is divided into first raster elements and lies in a first plane; and
an object plane;
wherein said first raster elements each has an x-dimension and a y-dimension with an aspect ratio,
wherein at least two of said first raster elements have aspect ratios of different magnitude,
wherein said first raster elements are arranged on a support structure in a plurality of rows,
wherein at least one of said plurality of rows includes at least two of said first raster elements,
wherein said first raster elements are mirrors, and
wherein said illumination system produces a two-dimensional image of said first raster elements in said object plane; and
an exit pupil;
(b) a pattern-bearing mask, situated in said object plane;
(c) a projection device, with an entrance pupil, which coincides with the exit pupil of the illumination system, wherein said projection device images an illuminated portion of said pattern-bearing mask in an image field of said projection device; and
(d) a light-sensitive substrate, situated in a plane in which said image field is situated.

16. A method for producing microelectronic components, comprising using the projection exposure system according to claim 15.

17. An illumination system, comprising:
an optical element having a plurality of raster elements arranged in a plurality of rows on a support structure,
wherein at least one of said plurality of rows includes at least two of said plurality of raster elements,
wherein said plurality of raster elements includes a first raster element having a first aspect ratio and a second raster element having a second raster element ahving a second aspect ratio,
wherein said first raster element is a first mirror and said second raster element is a second mirror,
wherein said first aspect ratio is not equal to said second aspect ratio,
wherein the illumination system defines a field to be illuminated in an object plane of the illumination system,
wherein said field represents a segment of a ring field, and
wherein said illumination system produces a two-dimensional image of said raster elements in said object plane.

18. The illumination system according to claim 17, wherein said support structure is a raster element plate.

* * * * *